United States Patent
Grubisik et al.

(10) Patent No.: US 10,680,150 B2
(45) Date of Patent: Jun. 9, 2020

(54) ELECTRICALLY CONDUCTIVE-SEMITRANSPARENT SOLID STATE INFRARED EMITTER APPARATUS AND METHOD OF USE THEREOF

(71) Applicants: Dragan Grubisik, Phoenix, AZ (US); Davorin Babic, Phoenix, AZ (US); Alex Kropachev, Chandler, AZ (US); Arshey Patadia, Tempe, AZ (US); Viet Nguyen, Phoenix, AZ (US)

(72) Inventors: Dragan Grubisik, Phoenix, AZ (US); Davorin Babic, Phoenix, AZ (US); Alex Kropachev, Chandler, AZ (US); Arshey Patadia, Tempe, AZ (US); Viet Nguyen, Phoenix, AZ (US)

(*) Notice: Subject to any disclaimer, the term of this patent is extended or adjusted under 35 U.S.C. 154(b) by 0 days.

(21) Appl. No.: 15/682,416

(22) Filed: Aug. 21, 2017

(65) Prior Publication Data
US 2019/0058098 A1    Feb. 21, 2019

Related U.S. Application Data

(63) Continuation-in-part of application No. 15/678,038, filed on Aug. 15, 2017.

(51) Int. Cl.
*H01L 33/26* (2010.01)
*H05B 33/22* (2006.01)
(Continued)

(52) U.S. Cl.
CPC ............. *H01L 33/62* (2013.01); *H01L 33/34* (2013.01); *H01L 33/56* (2013.01); *H01L 33/647* (2013.01);
(Continued)

(58) Field of Classification Search
CPC ......... H01L 33/28; H01L 33/34; H01L 33/38; H01L 33/42; H01L 33/46; H01L 33/56;
(Continued)

(56) References Cited

U.S. PATENT DOCUMENTS 4,086,608 A * 4/1978 Clawson ............. H01L 33/0025
257/190
5,500,569 A * 3/1996 Blomberg ................. H01K 1/02
313/522

(Continued)

FOREIGN PATENT DOCUMENTS

EP    3 462 149    * 4/2019 ................ G01J 5/08
GB    2 136 316    * 9/1984 ............. C03C 17/34

*Primary Examiner* — Mary A Wilczewski
(74) *Attorney, Agent, or Firm* — Kevin H. Hazen; Hazen Patent Group, LLC

(57) ABSTRACT

The invention comprises a solid state infrared source and method of use thereof comprising: (1) an electrically conductive film, comprising a semi-transparent material, the semi-transparent material comprising a transmission property of at least forty percent, wherein at least forty percent of internal infrared emissions from the electrically conductive film transmit to an outer surface of the electrically conductive film, wherein the infrared emissions comprise a peak intensity between 3.9 and 6 micrometers; (2) a first silicon nitride layer; and (3) a second silicon nitride layer, the electrically conductive film positioned between the first silicon nitride layer and the second silicon nitride layer, where applying an electric current of less than one Watt through the electrically conductive film raises a temperature of the electrically conductive film to in excess of eight hundred degrees centigrade in less than twenty milliseconds resultant in the infrared emissions.

2 Claims, 9 Drawing Sheets

(51) Int. Cl.
  *H01L 33/62* (2010.01)
  *H01L 33/64* (2010.01)
  *H01L 33/34* (2010.01)
  *H01L 33/56* (2010.01)
  *H01L 33/46* (2010.01)
  *H01L 33/38* (2010.01)
  *H01L 33/28* (2010.01)
  *H01L 33/42* (2010.01)

(52) U.S. Cl.
  CPC .............. *H05B 33/22* (2013.01); *H01L 33/28* (2013.01); *H01L 33/38* (2013.01); *H01L 33/42* (2013.01); *H01L 33/46* (2013.01)

(58) Field of Classification Search
  CPC ....... H01L 33/62; H01L 33/647; H05B 33/22; H05B 33/08; H05B 33/26; H05B 3/0033; H05B 3/141; H05B 3/143
  See application file for complete search history.

(56) References Cited

U.S. PATENT DOCUMENTS

| | | | | |
|---|---|---|---|---|
| 5,644,676 A * | 7/1997 | Blomberg | ............... | G01J 5/522 219/544 |
| 5,796,881 A * | 8/1998 | Manasson | ............ | H01Q 3/2676 385/14 |
| 5,827,438 A * | 10/1998 | Blomberg | ............... | G01J 3/108 219/544 |
| 5,869,386 A * | 2/1999 | Hamajima | ................ | G03F 9/70 148/DIG. 102 |
| 5,955,839 A * | 9/1999 | Jaffe | ......................... | H01K 1/04 219/543 |
| 6,297,511 B1 * | 10/2001 | Syllaios | ..................... | F41J 2/02 250/495.1 |
| 7,741,625 B2 * | 6/2010 | Rogne | ..................... | G01J 3/108 250/495.1 |
| 8,017,923 B2 * | 9/2011 | Inoue | ..................... | G01J 3/108 250/493.1 |
| 8,410,560 B2 * | 4/2013 | Ali | ......................... | H05B 3/267 257/414 |
| 8,492,737 B2 * | 7/2013 | Araci | ..................... | B82Y 20/00 219/411 |
| 8,859,303 B2 * | 10/2014 | Udrea | ..................... | H05B 3/267 438/22 |
| 8,946,739 B2 * | 2/2015 | Carothers | ............. | H05B 3/265 257/440 |
| 9,105,368 B2 * | 8/2015 | Nagatani | ................ | G01J 3/108 |
| 9,214,604 B2 * | 12/2015 | Ali | ......................... | H01L 33/34 |
| 9,733,404 B2 * | 8/2017 | Talvitie | ..................... | G01J 5/20 |
| 10,299,344 B2 * | 5/2019 | Babic | ..................... | H05B 33/26 |
| 10,320,143 B2 * | 6/2019 | Kropachev | ............. | H01S 3/10 |
| 2006/0001005 A1 * | 1/2006 | Kishimoto | ............. | C03C 3/085 252/301.33 |
| 2010/0323160 A1 * | 12/2010 | Nakahara | ................ | C30B 23/02 428/141 |
| 2012/0235067 A1 * | 9/2012 | Araci | ..................... | B82Y 20/00 250/504 R |
| 2016/0343921 A1 * | 11/2016 | Stanley | ..................... | H01L 33/26 |
| 2018/0120158 A1 * | 5/2018 | Blomberg | ................ | G01J 3/108 |
| 2019/0058098 A1 * | 2/2019 | Grubisik | ................ | H05B 33/22 |
| 2019/0058302 A1 * | 2/2019 | Kropachev | ................ | H01S 3/10 |
| 2019/0059139 A1 * | 2/2019 | Grubisik | ................ | H05B 33/26 |
| 2019/0059140 A1 * | 2/2019 | Babic | ..................... | H05B 33/26 |

* cited by examiner

US 10,680,150 B2

ELECTRICALLY CONDUCTIVE-SEMITRANSPARENT SOLID STATE INFRARED EMITTER APPARATUS AND METHOD OF USE THEREOF

CROSS-REFERENCES TO RELATED APPLICATIONS

This application is a continuation-in-part of U.S. patent application Ser. No. 15/678,038 filed Aug. 15, 2017.

BACKGROUND OF THE INVENTION

Field of the Invention

The invention relates generally to a light source.

Discussion of the Prior Art

Patents related to the current invention are summarized here.

Proton Beam Therapy System

P. Nordal, et. al., "Infrared Emitter and Methods for Fabricating the Same", U.S. Pat. No. 6,031,970 (Feb. 29, 2000) describe an infrared radiation source, comprising a thin, electrically conducting film adapted to emitted infrared radiation when heated.

I. Romanov, et. al., "High-Temperature Nanocomposite Emitting Film, Method for Fabricating the Same and its Application", World Patent application no. WO 2014/168977 A1 (Oct. 16, 2014) describe a thin-film radiative structure comprising molybdenum, silicon, carbon, and oxygen.

Problem

There exists in the art of light sources a need for an accurate, precise, miniaturized, and rapidly switchable infrared light source.

SUMMARY OF THE INVENTION

The invention comprises a mid-infrared light source apparatus and method of use thereof.

DESCRIPTION OF THE FIGURES

A more complete understanding of the present invention is derived by referring to the detailed description and claims when considered in connection with the Figures, wherein like reference numbers refer to similar items throughout the Figures.

Elements and steps in the figures are illustrated for simplicity and clarity and have not necessarily been rendered according to any particular sequence. For example, steps that are performed concurrently or in different order are illustrated in the figures to help improve understanding of embodiments of the present invention.

DETAILED DESCRIPTION OF THE INVENTION

The invention comprises a solid state infrared source and method of use thereof comprising: (1) an electrically conductive film, comprising a semi-transparent material, the semi-transparent material comprising a transmission property of at least forty percent, wherein at least forty percent of internal infrared emissions from the electrically conductive film transmit to an outer surface of the electrically conductive film, wherein the infrared emissions comprise a peak intensity between 3.9 and 6 micrometers; (2) a first silicon nitride layer; (3) a second silicon nitride layer, the electrically conductive film positioned between the first silicon nitride layer and the second silicon nitride layer; (4) a first electrical contact on a first end of the electrically conductive film; and (5) a second electrical contact on a second end of the electrically conductive film, where applying an electric current of less than one Watt through the electrically conductive film raises a temperature of the electrically conductive film to in excess of eight hundred degrees centigrade in less than twenty milliseconds.

Light Source

Figure 1:
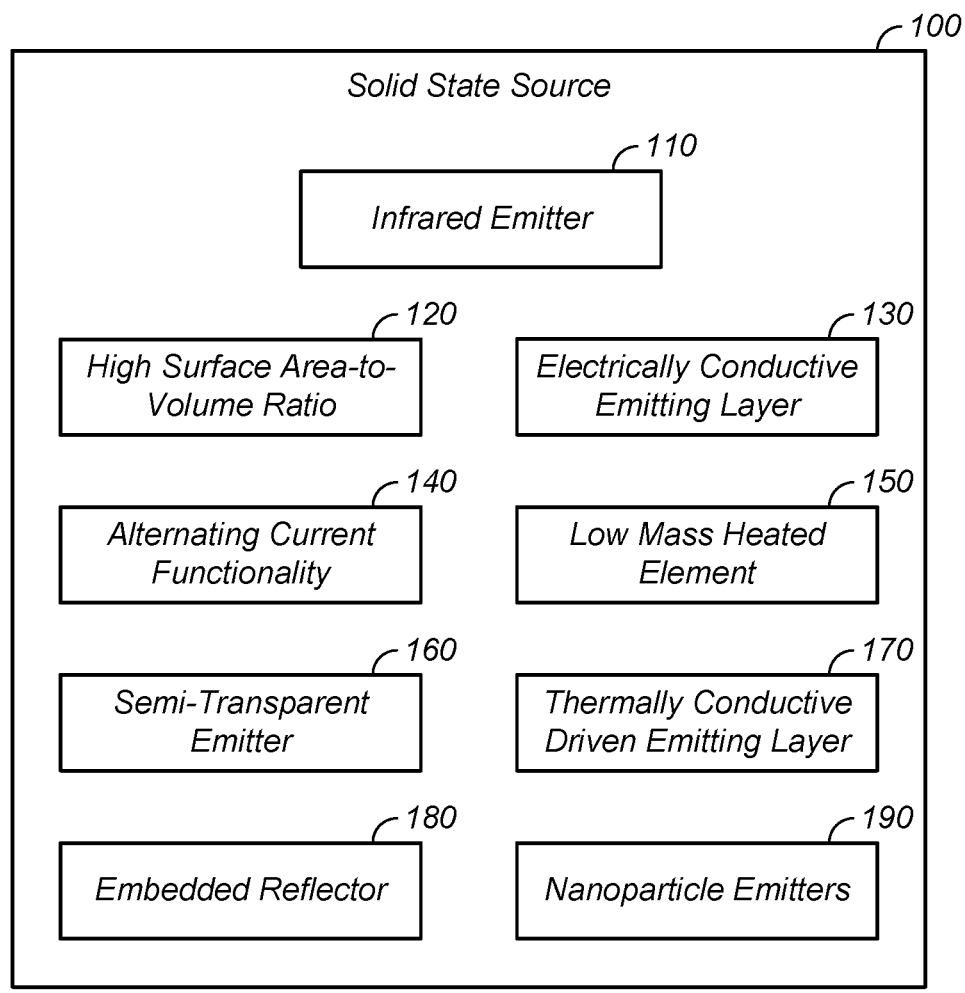
FIG. 1 illustrates novel elements of a solid state emitter.

Referring now to FIG. 1, a solid state source 100 is described. Generally, the solid state source 100 comprises a light emitting element, which emits photons in the infrared region of the electromagnetic spectrum.

In one embodiment, still referring to FIG. 1, the light emitting element emits photons/energy as a blackbody radiator, such as in the mid-infrared region of the electromagnetic spectrum between two and six micrometers and more preferably with a peak emission intensity in a range of four to six micrometers.

Still referring to FIG. 1, the solid state source 100 comprises one or more of:
- a mid-infrared/infrared light source;
- an infrared emitter, such as a metal oxide, a ceramic, and/or a cermet;
- a current and/or heat driven infrared emitter 110;
- a high surface area-to-volume ratio 120 of the infrared emitter 110, such as greater than 200, 500, 1000, or 2000 to 1;
- an electrically conductive emitting layer 130;
- an alternating and/or pulsed current functionality 140;
- a low mass heated element 150;
- a semi-transparent emitter 160;
- a thermally conductive driven emitting layer 170;
- an embedded reflective layer 180; and
- a nanoparticle, a metal oxide and/or a ceramic, emitter 190.

Each of the infrared emitter 110, the high surface area-to-volume ratio 120 of the infrared emitter 110, the electrically conductive emitting layer 130, the pulsed current functionality 140, the low mass heated element 150, the semi-transparent emitter 160, the thermally conductive driven emitting layer 170, the embedded reflective layer 180, and the nanoparticle emitter 190 are further described, infra.

Herein, for clarity of presentation, a metal oxide and/or a semi-conducting metal oxide is used as an example of the infrared emitter 110; however, optionally a ceramic is used in place of the metal oxide and/or an inorganic, non-metallic, optionally crystalline oxide, nitride or carbide material is used in place of the metal oxide.

Elements of the solid state source 100, described herein, function together, but are optionally arranged in many permutations and combinations. For clarity of presentation and without loss of generality, multiple examples are provided herein to illustrate functionality of individual elements of the solid state source 100 and to illustrate useful substructures and combinations of individual elements of the solid state source 100.

Example I

Figure 2:
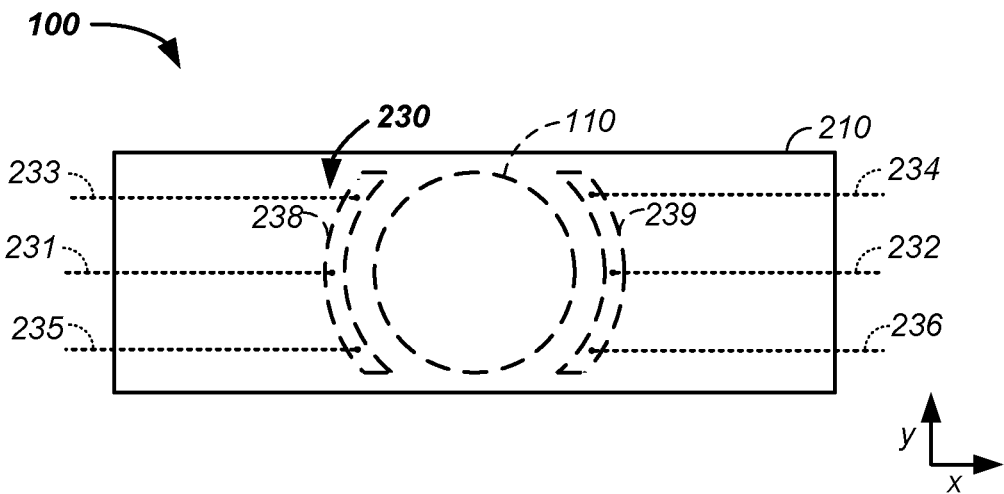
FIG. 2 illustrates a top view of an infrared source.

Referring now to FIG. 2, a first example of the solid state source 100 is illustrated, from a top or emission end view. Generally, the solid state source 100 comprises: a case 210 or housing and the infrared emitter 110. The infrared emitter 110 emits light/photons/energy in the infrared range of 1.1 to 20 µm and/or the mid-infrared range of 2.5 to 20 µm. More preferably, the infrared emitter 110 emits photons having wavelengths longer than 2, 2.5, 3, 3.5, or 4 µm and/or has a peak intensity of emission in a range of 2 to 6 µm or 4 to 6 µm. The infrared emitter 110 as described herein has a longer wavelength of peak emission, of 4 to 5 µm, compared to competing molybdenum and/or carbon based emitters. Further, the infrared emitter 110, as described herein, emits at least 10 or 20 percent more light in the range of 3.9 to 8 µm than the competing molybdenum and/or carbon based emitters. As illustrated, the infrared emitter 110 is circular. However, the infrared emitter 110 is optionally of any shape such as triangular, square, rectangular, and/or polygonal as the infrared emitter shape is optionally and preferably formed in a mask/etching step, as further described infra. As illustrated, the infrared emitter 110 is embedded into the solid state source 100 and is optionally and preferably coated with at least a capping layer 350, as further described infra. However, the infrared emitter 110 optionally comprises an outermost surface of the solid state source 100.

Still referring to FIG. 2, an electrical system 230 of the solid state source 100 is illustrated. Generally, the electrical system 230 comprises a first contact 238 and a second contact 239 on opposite sides, such as radial sides, of the infrared emitter 110. A first wire 231 and a second wire 232 carry current to/from the first contact 238 and the second contact 239, respectively. The current passes from the first contact 238, through the infrared emitter 110, and into the second contact 239 or vise-versa, which raises the temperature of the infrared emitter to 1000° C. or within 25, 50, 100, or 200° C. of 1000° C. based upon the applied current while using less than 1 Watt. Stated another way, the infrared emitter comprises the electrically conductive emitting layer 130 and/or is the electrically conductive emitting layer 130. The current heats the infrared emitter 110, which results in radiative relaxation of the infrared emitter 110 and/or the emission of photons, in the infrared region of the electromagnetic spectrum, from the infrared emitter 110. The current is optionally direct current, such as generated using less than 0.5, 1, 2, or 5 Watts. However, preferably, the current is a pulsed current, such as faster than 1 Hz operating at less than 0.1, 0.5, 1, 2, or 5 Watts.

The pulsed current functionality 140, provides pulsed heat, by way of electrical resistance, to the infrared emitter 110, which coupled with: (1) the low thermal mass of the heated element 150 or the infrared emitter 110, allowing for rapid heating and cooling; (2) the high surface area-to-volume ratio 120 of the infrared emitter 110, allowing for rapid cooling; and/or (3) insulating layers, described infra, sandwiching the thin infrared emitter 110, which reduces/prevents current driven thermal heating of adjacent layers, yields pulsed intensity of the solid state source 100 at the alternating and/or pulsed current frequency, as further described infra. Applied currents are optionally and preferably greater than 100, 200, 300, or 400 mW and less than 700, 800, 1000, or 1200 mW. Optional pairs of a third wire 233 and a fourth wire 234 and/or a fifth wire 235 and a sixth wire 236 are used to distribute electrons across the first contact 238 and/or the second contact 239, an thus across the infrared emitter 110. The distributed current results in distributed heating of the infrared emitter 110 and thus a more uniform profile of intensity as a function of wavelength versus x/y-position of the infrared emitter 110. Similarly, the optional curved shape of the first contact 238 and/or the second contact 239, to provide a more uniform distance to a chosen shape of the infrared emitter 110, functions to smooth the current across the infrared emitter 110, distribute resulting heat on the infrared emitter 110, and/or to yield a more uniform emission profile of the infrared emitter 110 as a function of x/y-position. For clarity of presentation, components of the electrical system 230 are generally not illustrated in subsequent examples, though the electrical system is optionally and preferably connected to the infrared emitter 110 in all illustrated embodiments.

Example II

Figure 3:
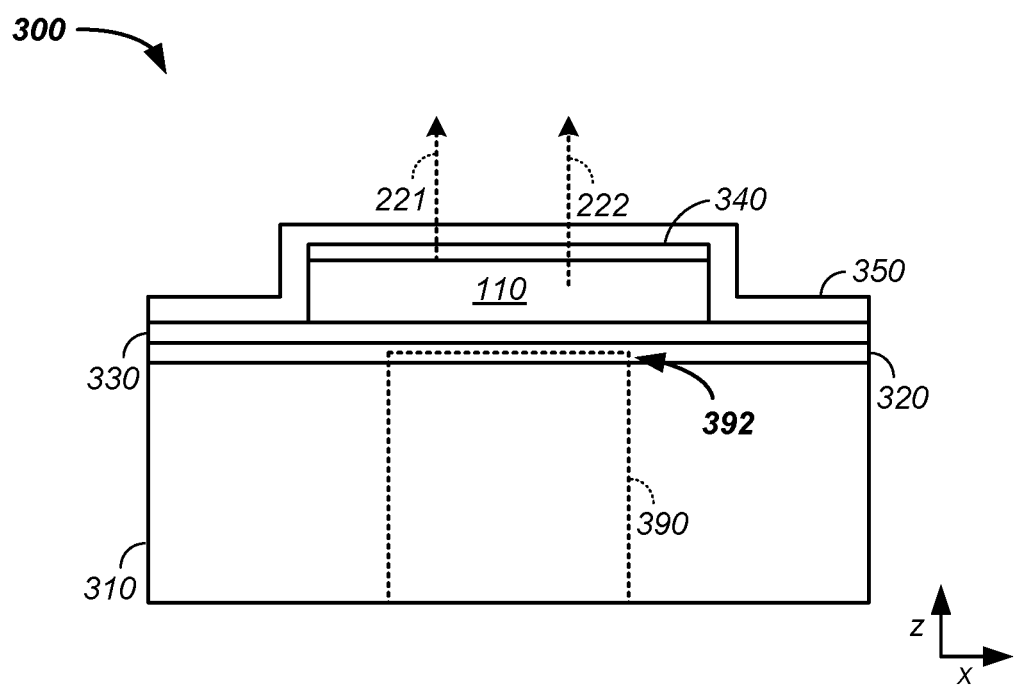
FIG. 3 illustrates a side view of the infrared source.

Referring now to FIG. 3, a second example of the solid state source 100 is illustrated, from a side view. Emissions from the infrared emitter 110 include surface emitted photons 221, which emit from a surface of the infrared emitter 110 and body emitted photons 222, which emit from an internal volume of the infrared emitter 110, transmit through an internal pathlength in the infrared emitter 110, and pass through an outer perimeter of the infrared emitter 110. Herein, transmittance of the infrared emitter 110 is at least 10, 20, 30, 40, 50, 60, 70, 80, or 90 percent, where transmittance is the percent of photons emitted from the internal volume of the infrared emitter 110 than reach an outer perimeter of the infrared emitter 110.

Still referring to FIG. 3, the infrared emitter 110 is encapsulated, such as by a set of encapsulation layers and/or dielectric films. As illustrated, the set of encapsulation layers comprise: a first layer 330, a second layer 340, and a capping layer 350. Optionally and preferably, the first layer 330 and the second layer each comprise a dielectric film and/or a silicon nitride film. Optionally and preferably: (1) the first layer 330 comprises a low pressure chemical vapor deposition (LP-CVD) layer deposited at a relatively higher temperature of 800° C.±100, 200, or 300° C. and (2) the second layer 340 comprises a plasma enhanced chemical vapor deposition (PCVD) layer deposited at a relatively lower temperature of 350° C.±50, 100, or 150° C. The first layer 330 and the second layer 340 optionally and preferably substantially contact opposite sides of the infrared emitter 110, which is optionally and preferably an elongated deposited film. The first layer 330, intermediate infrared emitter 110, and second layer 340, referred to herein as the infrared emitter assembly, rotate with the solid state source 100. The first layer 340 is optionally any mechanical enhancement film used to support the infrared emitter 110 and is preferably a first silicon nitride layer substantially comprising $SiN_x$ after annealing, where x is a positive integer. The second layer 340 is optionally any material protecting the infrared emitter 110 from oxidation and is preferably a second silicon nitride layer substantially comprising $SiN_y$ after annealing, where y is a positive integer that is optionally greater or less than x. The optional capping layer 350 is any material protecting the outer surfaces of the infrared emitter 110, such as ends and edges of the film, from the environment and/or from oxidation and is preferably a third silicon nitride layer. Generally, any number and/or type of encapsulating layers are used in the solid state source 100 at any number of positions and/or locations.

Example III

Still referring to FIG. 3, for clarity of presentation and without loss of generality, a first composite construction 300 of the solid state source 100 is illustrated in a third example. As illustrated, the solid state source 100 comprises: (1) a substrate 310, such as a silicon substrate; (2) an oxidized layer 320, such as a silicon dioxide layer; (3) the infrared emitter assembly with the first layer 330 substantially covering and substantially contacting an outer face of the oxidized layer 320; and (4) the optional capping layer 350 covering at least the edges of the exposed infrared emitter 110 and preferably covering the front surface of the infrared emitter 110.

Example IV

Referring still to FIG. 3, for clarity of presentation and without loss of generality, a fourth example of the solid state source 100 is illustrated where the solid state source 100 comprises a thermal mass reduction. As illustrated, an aperture 390 is formed in the substrate 310 to reduce the thermal mass of the solid state source 100. As illustrated, the aperture extends into the substrate 390 of the solid state probe 100 and optionally and preferably extends to a deepest penetration 392 part way through the oxidized layer 320. The cross-section shape of the aperture 390 is of any shape and optionally and preferably matches a cross-section shape of the infrared emitter 110. The aperture 390, preferably, does not extend into the infrared emitter 110. The aperture 390 is optionally formed by any means, such as predrilling or drilling, but is preferably etched.

Example V

Figure 4A:
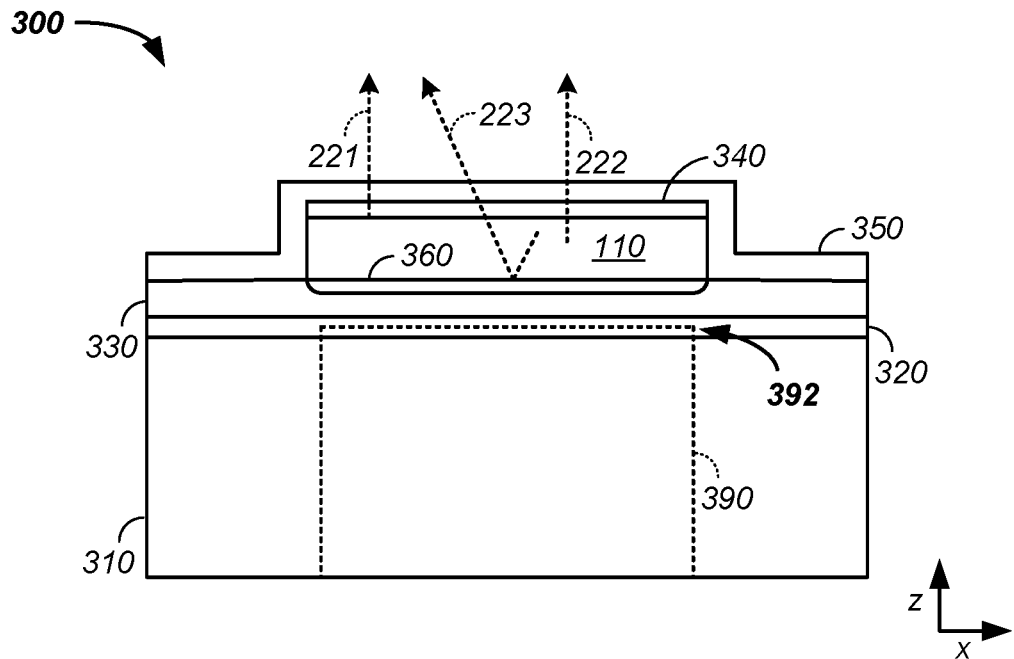
FIG. 4A and FIG. 4B illustrates a reflector, back reflector, or reflective layer embedded in the infrared source.
Figure 4B:
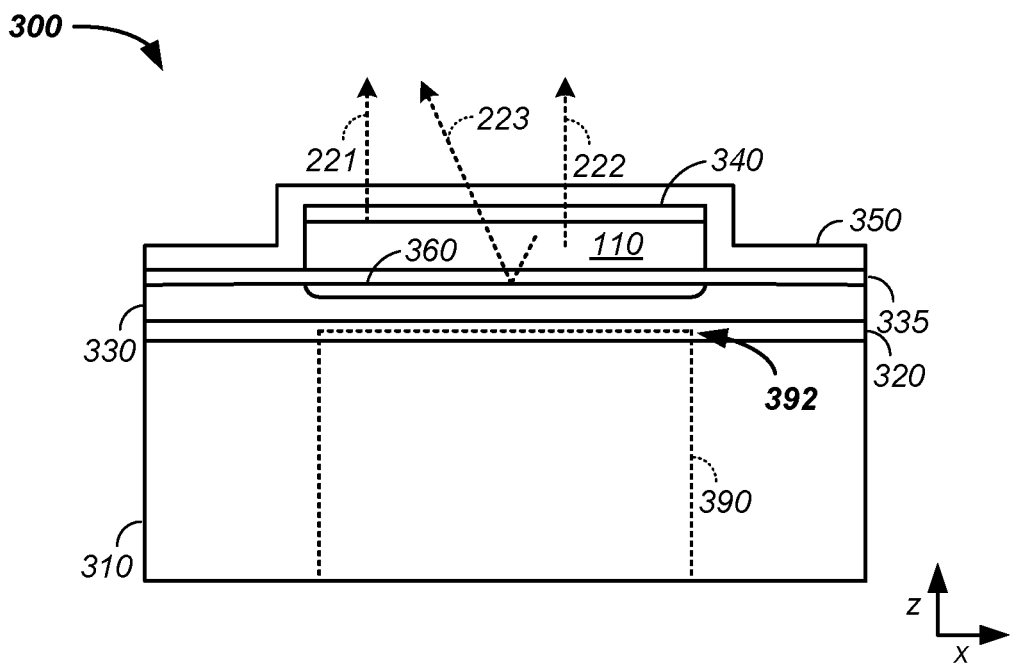

Referring now to FIG. 4A, a fifth example of the solid state source 100 is illustrated, where the solid state source 100 comprises an embedded reflector or reflective layer 360. Generally, the embedded reflective layer 360 comprises a mirror, a mirror layer, a reflective layer, a photon reflective layer, a metalized layer, a diffusely reflective layer, and/or an index of refraction mismatched layer. The embedded reflective layer 360 comprises a layer or partial layer anywhere in the solid state source 100, such as physically contacting the infrared emitter 110 or removed by 1, 2, 3, or more layers from the infrared emitter 110. Generally, photons emit from the solid state source 100 on a front side of the infrared emitter 110 and the embedded reflective layer 360 is positioned on a back side of the infrared emitter 110. The embedded reflective layer 360 is optionally formed as an focusing or defocusing element through control of shape of the embedded reflective layer 360. As illustrated, the embedded reflective layer 360 comprises a deposited film layer substantially contacting and covering the back side of the infrared emitter 110. Optionally, an intervening layer, such as a silicon nitride layer is positioned between the embedded reflective layer 360 and the infrared emitter 110. As illustrated, a preliminary etching step, described infra, etched away a portion of the first layer 330 to form a cavity substantially filled by the embedded reflective layer 360. Preferably, the first layer 330 is the first silicon nitride layer, $SiN_x$, formed by low pressure chemical vapor deposition, deposited at 800° C.±50° C. onto a silicon dioxide layer. Referring now to FIG. 4B, an optional layer, a secondary lower sandwiching layer 335, such as a silicon nitride layer, is illustrated in the $SiN_x$:ZnO:$SiN_y$ sandwich assembly.

Still referring to FIG. 4A, the infrared emitter 110 is illustrated emitting three classes of photons. The three classes of photons comprise: (1) the surface emitted photons 221, which emit from the surface of the infrared emitter 110; (2) the body emitted photons 222, which emit from an internal volume of the infrared emitter 110 and transmit through an internal pathlength in the infrared emitter 110; and (3) reflected photons 223, which comprise photons from the first and/or second class that back reflect off of the embedded reflective layer 360 and subsequently pass through the outer perimeter of the infrared emitter 110. The inventor notes that traditional infrared emitters are not transparent, which results in a lower observed photon intensity as only the first class of emitters, the surface emitters, are observed. Optionally and preferably, the transmittance of the infrared emitter 110 is high enough to yield at least a 10, 20, 30, or 50 percent increase in photons emerging from the front side of the infrared emitter 110 when the embedded reflective layer 360 is positioned in the solid state source 100.

Example VI

Figure 5A:
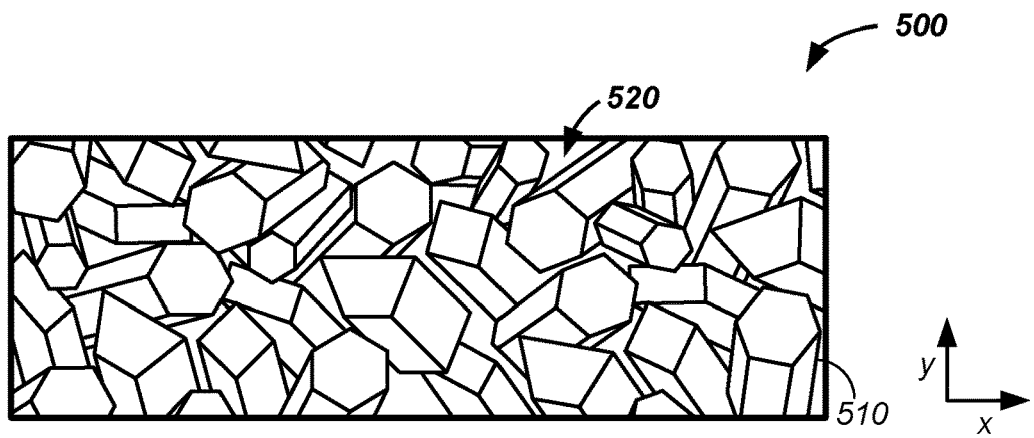
FIG. 5A illustrates metal oxide nanoparticles in an infrared source and FIG. 5B illustrates the metal oxide nanoparticles coupled to a switchable heating element.
Figure 5B:
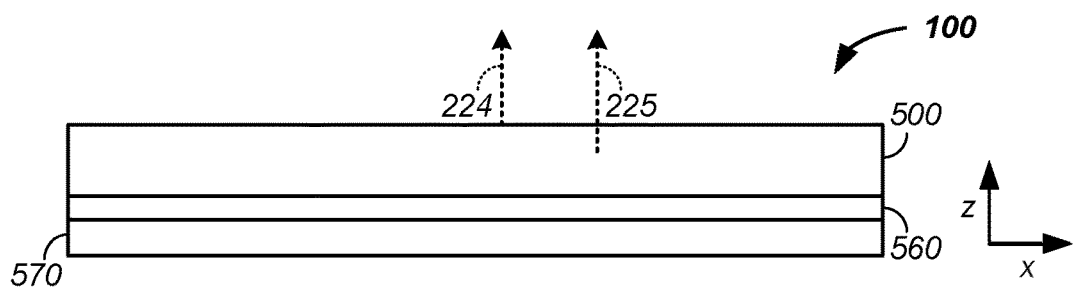

Referring now to FIG. 5A and FIG. 5B, a sixth example of the solid state source 100 is illustrated using a nanoparticle metal oxide layer 500. Generally, the nanoparticle metal oxide layer 500 comprises metal oxide nanoparticles 510 of any geometry. Optionally and preferably, the metal oxide nanoparticles 510 comprises nanocrystals, nanoplatelets, and/or nanotubes, also referred to herein as nanorods. Generally, the metal oxide nanoparticles 510 comprise nanoparticles with a mean minimum cross-section distance of less than 1000, 100, 50, 25, 10, 5, or 2 µm and greater than 1 nm. The nanoparticle metal oxide layer 500 optionally contains gaps 520, between the metal oxide nanoparticles 510. The gaps comprise a mean average distance between the metal oxide nanoparticles 510 that is less than 1000, 100, 50, 25, 10, 5, or 2 nm and greater than 0.1 nm and is preferably less than the mean minimum cross-section distance of the metal oxide nanoparticles 510 and/or within 10, 20 50, 100, or 200 percent of the mean minimum cross-section distance of the metal oxide nanoparticles 510. Preferred metal oxide nanoparticles comprise: oxides of zinc, silicon, molybdenum, and carbon with optional dopants and/or impurities of any element, such as chemical forms of aluminum, bromine, boron, fluorine, chromium, hafnium, titanium, and silicon. The nanoparticle metal oxide layer 500 is optionally used as the infrared emitter 110.

Example VII

Referring still to FIG. 5A and FIG. 5B, a seventh example of the solid state source 100 is described. In a first case, the gaps 520 comprise air and in a second case, the gaps 520 are substantially filled with a deposited gap filling material, such as greater than 70, 80, 90, or 95 percent filled on an emission surface of the nanoparticle metal oxide layer 500. Generally, resultant from thermal heating, one of the metal oxide nanoparticles 510 emits a photon, which travels through one or more of the gaps 520 and optionally travels through one or more of the remaining metal oxide nanoparticles 510, through a process of transmission and/or scattering, until the photon emits from the nanoparticle metal oxide layer 500, such as toward a reflector or reflective layer or within a solid angle of emission on a front surface of the nanoparticle metal oxide layer 500. Naturally, a multitude of photons emit from metal oxide nanoparticles 510 and follow individual paths within the nanoparticle metal oxide layer 500 prior to emission. Optionally, in a first gap filled case of the nanoparticle metal oxide layer 500, the deposited gap filling material comprises an index of refraction that increases a net emission of photons from the nanoparticle metal oxide layer 500 compared to a second case of the nanoparticle metal oxide layer 500 comprising air in the gaps 520. A preferred index of refraction of the deposited gap filling material is in the range of 1.45 to 3.0 and/or within 0.5 and/or 1.0 of an index of refraction of the metal oxide nanoparticles 510. For instance, in the case of the metal oxide nanoparticles 510 comprising substantially zinc oxide with an index of refraction of 1.8, the index of refraction of the deposited gap filling material is optionally 1.8±0.5 and/or 1.8±1.0. The gap filling material is optionally mixed with, deposited, and/or sputtered onto/into the metal oxide, optionally under a partial vacuum, such as into a powder form of the metal oxide nanoparticles 510 and subsequently baked, annealed, and/or treated with ultrasound to set the nanoparticle metal oxide layer 500 and/or drive off air from the volume of the nanoparticle metal oxide layer 500.

Example VIII

Figure 6:
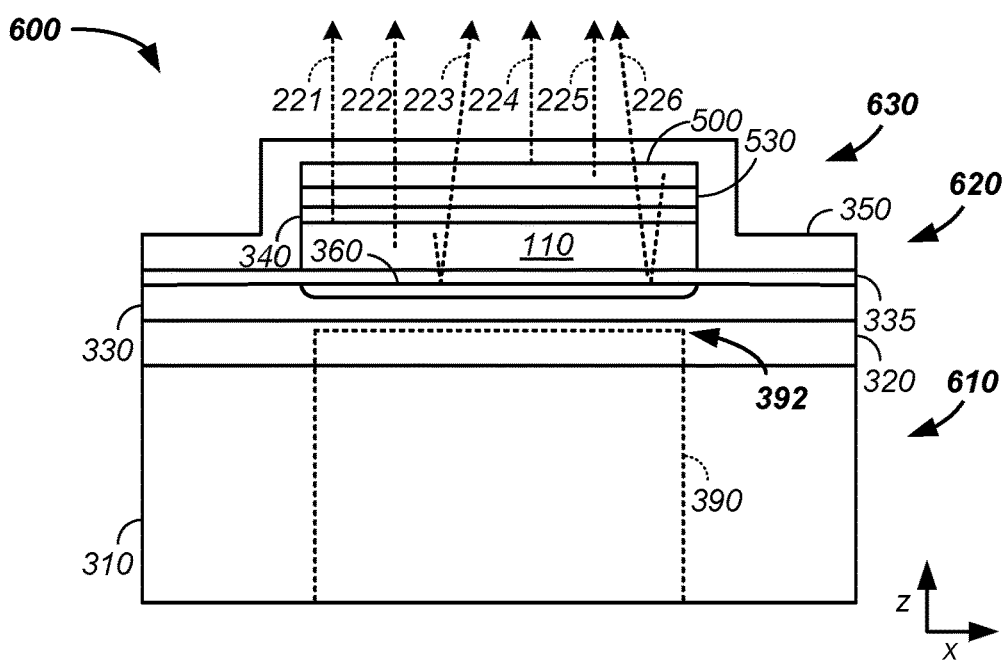
FIG. 6 illustrates a low mass semi-transparent, electrically conductive metal oxide light emitter coupled to the reflective layer in the solid state emitter.

Referring now to FIG. 5B, an eighth example of the solid state source 100 is described. As illustrated, the solid state source 100 comprises a heating element 560 and the nanoparticle oxide layer 500. In use, resultant from heating using the heating element 560, the metal oxide nanoparticles 510 of the nanoparticle oxide layer 500 emit photons, such as a fourth class of photons 224 emitted from the surface of the nanoparticle oxide layer 500 and/or a fifth class of photons 225 emitted from an internal volume of the nanoparticle oxide layer 500, which are subsequently transmitted/diffusely reflected through the metal oxide nanoparticles 510 and/or the gaps 520 until emission from a front emission surface of the nanoparticle oxide layer 500. A sixth class of photons 226 comprises the fourth class of photons 224 and/or the fifth class of photons 225 that reflect off of the embedded reflective layer 360 and are subsequently emitted from the solid state source, as illustrated in FIG. 6.

Still referring to FIG. 5B, the nanoparticle oxide layer 500 is optionally heated by the heating element 560 and/or heated via conductive heat resultant from heating of the infrared emitter 110 based on a current flow through the infrared emitter 110, as described supra.

Still referring to FIG. 5B, in practice the solid state source 100 comprises one or both of the nanoparticle oxide layer 500 and the infrared emitter 110. As illustrated, the nanoparticle oxide layer 500 and heater element 560 are supported on the support element 570. Optionally, the nanoparticle oxide layer 500 and or the heater element 560 are supported by and/or in contact with any one or more of: a support element 570, which is optionally the substrate 310, silicon, the first layer 320, silicon dioxide, a mechanical support layer, an oxidation reduction layer, the second layer 330, the lower silicon nitride layer, the third layer 340, the upper silicon nitride layer, a silicon nitride deposit, the capping layer 350, the infrared emitter 100, and/or an intervening layer between the nanoparticle oxide layer 500 and the infrared emitter 110.

Example IX

Referring now to FIG. 6, a ninth example of the solid state source 100 is illustrated. In this example, multiple subsections, described supra, of the solid state source 100 are integrated. Particularly, a base section 610 is integrated with an infrared emitter section 620 and a zinc oxide nanoparticle section 630. In this example, the base section 610 comprises: a silicon substrate, a silicon oxide layer, and a thermal mass reduction section. The infrared emitter section 620 comprises: a zinc oxide emitter coupled to a back reflector, such as the first layer 330: infrared emitter 110: second layer 340 sandwich assembly, optionally with a secondary lower sandwiching layer 335 sandwiched between a first nitride layer and the zinc oxide layer couple to the back reflector. The zinc oxide nanoparticle section comprises: zinc oxide nanoparticles in a film comprising gaps, optionally filled, between the zinc oxide nanoparticles. Generally, any of the layers are deposited films and any of the sections are layers of deposited films. The layers and/or sections are optionally configured in any combination and/or permutation to emit light from the solid state source 100 along a first illumination face and optionally to emit light from two or more illumination faces, such as a left face and a right face.

Manufacturing

Herein, four exemplary manufacturing process are illustrated. Steps in the first, second, third, and/or fourth manufacturing example are optionally implemented in many orders, with omission of one or more steps or layers, and/or with inclusion of one or more additional steps or layers. It should be appreciated that the three manufacturing examples are presented to facilitate a description of the solid state source 100 without loss of generality. Further, descriptions of elements and/or steps in the four exemplary manufacturing examples are optionally implemented in the above described solid state source 100 examples and vise-versa.

Example I

Figure 7A:
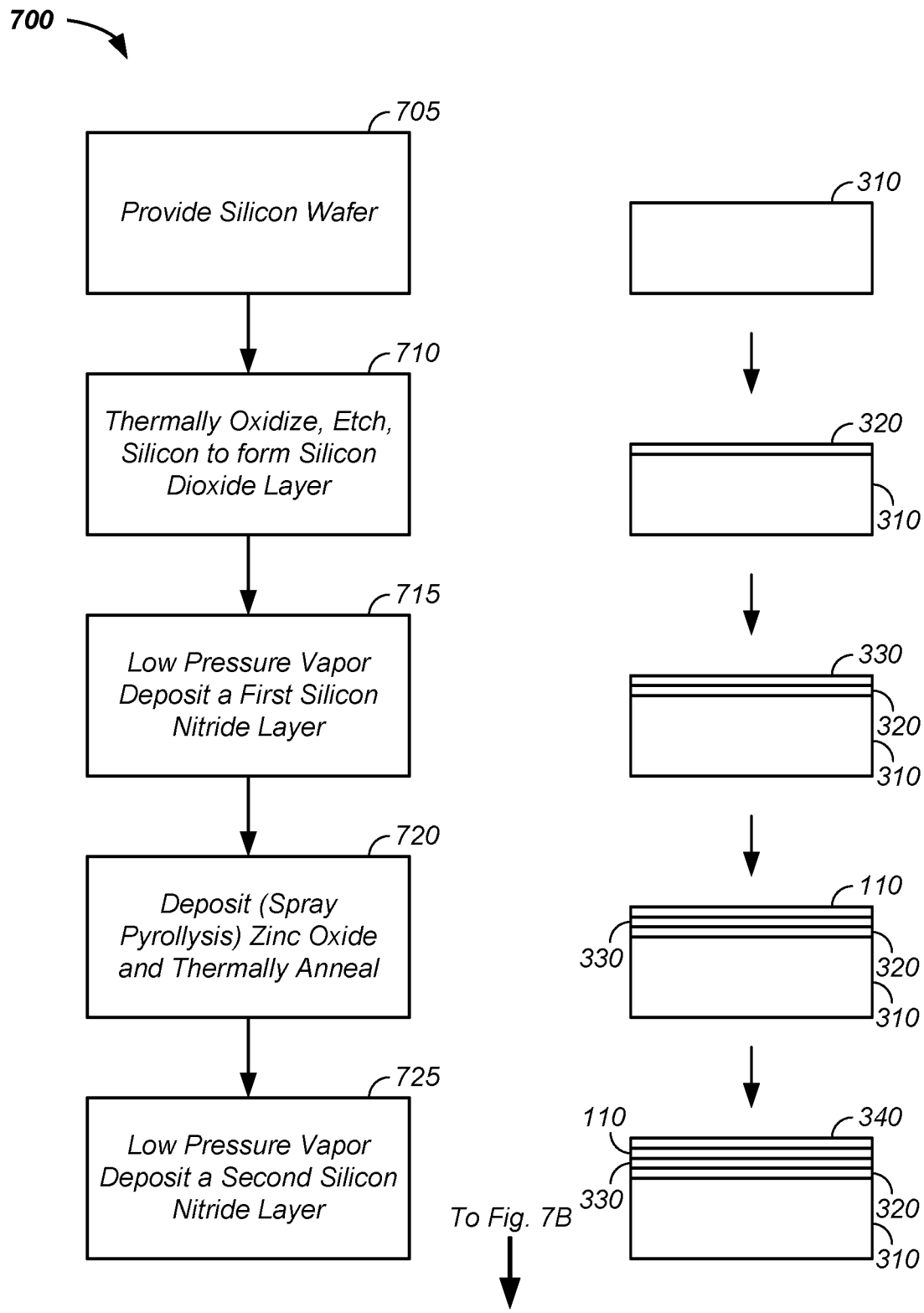
FIG. 7A and FIG. 7B illustrate a first exemplary manufacturing process of the solid state emitter.
Figure 7B:
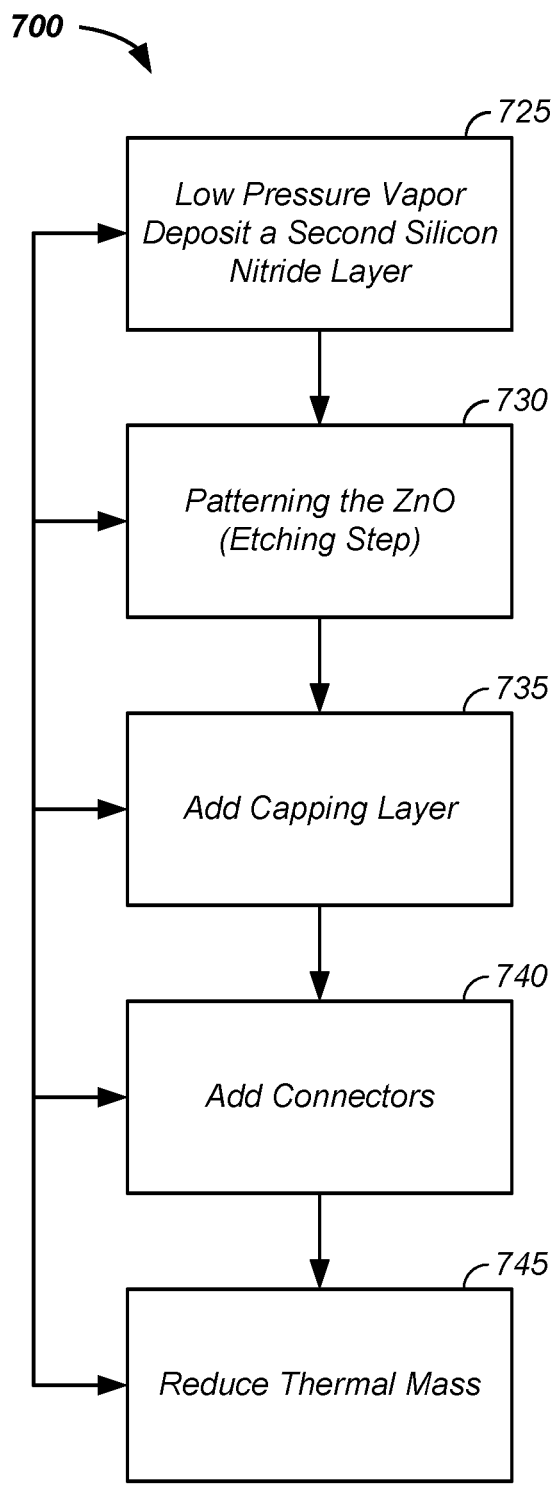
Figure 7B:
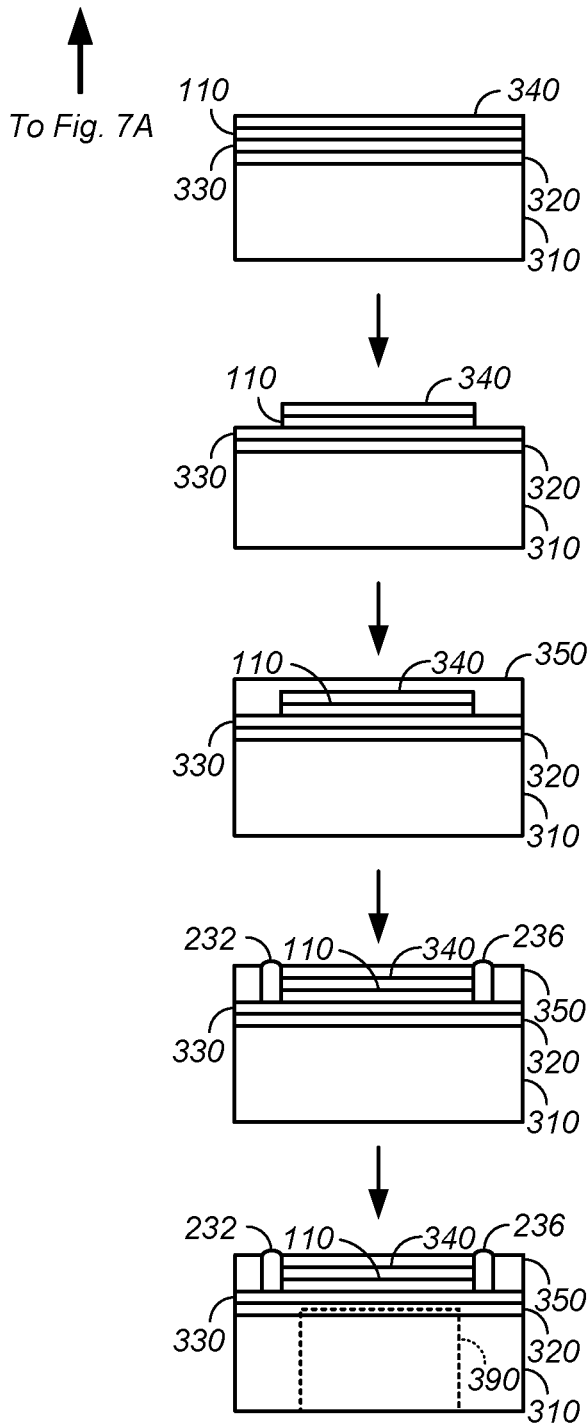

Referring now to FIG. 7A and FIG. 7B a first manufacturing example is illustrated. As illustrated, for clarity of presentation and without loss of generality, an example of the solid state source 100 is built upward from a base substrate to a top capping layer. For clarity of relating individual layers of a set of layers, such as the oxidized layer 320, the first layer 330, the infrared emitter 110, the second layer 340, and the capping layer 350, to steps in a first manufacturing procedure using particular chemical layers and/or processes, the particular chemical layers are illustrated side-by-side with the set of generic layers. The first manufacturing procedure 700 comprises one or more of the steps of:

providing a silicon, Si, wafer 705;
thermally oxidizing 710 and/or etching the silicon wafer to form a silicon dioxide, $SiO_2$, layer;
depositing a first silicon nitride, SiN or $SiN_m$, 715 layer to the silicon dioxide layer, such as through use of low pressure chemical vapor deposition, to form a mechanical support layer with optional oxidation protection properties;

depositing a zinc oxide, ZnO, 720 layer to the first silicon nitride layer, such as through a spray pyrolysis or a plasma vapor deposition process with an optional and preferred subsequent step of thermal annealing to form a zinc oxide material, $Zn_xO_y$, (ZnO→$Zn_xO_y$), where y is less than x, such as at a ratio, y:x, of less than 1:2, 1:5, 1:9, 1:10, 1:10, 1:100, and/or 1:1000;

depositing a second silicon nitride, SiN or $SiN_n$, layer 725 and/or a low stress nitride to the zinc oxide material, such as through use of a second low pressure chemical vapor deposition step, to form an oxidation protection surface on the zinc oxide, where m=n or preferably m≠n;

patterning 730 the zinc oxide layer, such as via etching away: a portion of the second silicon nitride layer and a portion of the zinc oxide layer;

adding a capping layer 735, such as another silicon nitride layer formed using low pressure chemical vapor deposition;

adding connectors 740 to the zinc oxide, which is an infrared emitter layer, through forming a set of holes/channels to the zinc oxide and adding/depositing a metal connector material in the set of holes/channels along with a wired connection of the formed metal connectors to a power supply and/or a main controller, which controls subsequent applied current to/through the zinc oxide; and reducing a thermal mass 745 of the resulting solid state source 100, such as through removal of a portion of the silicon wafer and/or the silicon dioxide layer proximate the zinc oxide infrared emitter section.

Example II

Figure 8:
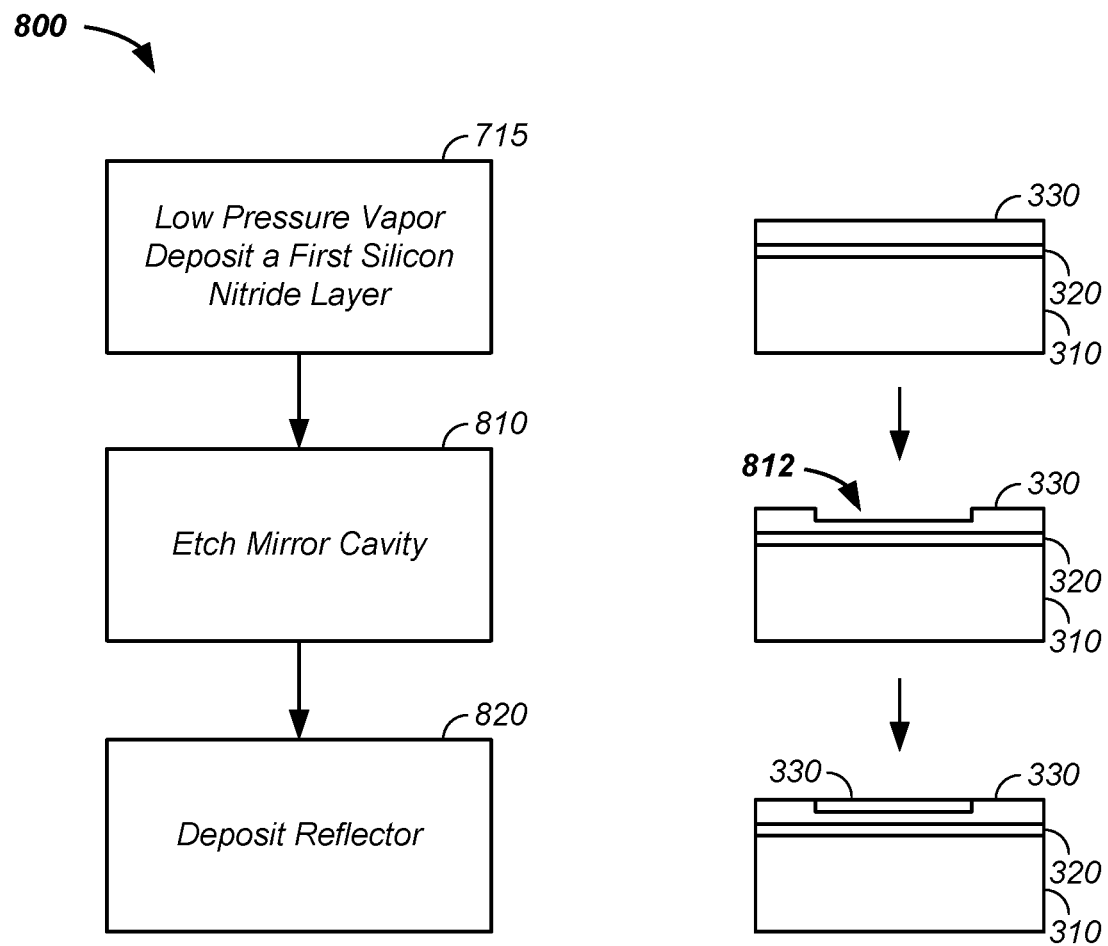
FIG. 8 illustrates a manufacturing process of the embedded reflective layer of the solid state emitter.

Referring now to FIG. 8 a second manufacturing example is illustrated. In this example, an embedded reflecting element is added to the solid state source 100. The second manufacturing procedure 800 comprises one or more of the steps of:

the above described step of depositing a first silicon nitride, SiN or $SiN_m$, 715 layer to a starting layer, such as the silicon dioxide layer, through use of a deposition process, such as the low pressure chemical vapor deposition process, to form a mechanical support layer with optional oxidation protection properties;

a step of etching a mirror cavity 810 into the first silicon nitride layer; and depositing a reflective material 820 into the mirror cavity.

Instances of use of the second manufacturing procedure 800 comprise: adding a back reflecting surface behind, below as illustrated in FIG. 6, the thermal irradiator or infrared emitter 110; adding a mirrored element behind the zinc oxide layer; adding a reflective surface behind the nanoparticle metal oxide layer 500; and/or forming a light directing reflective optic.

Example III

Figure 9A:
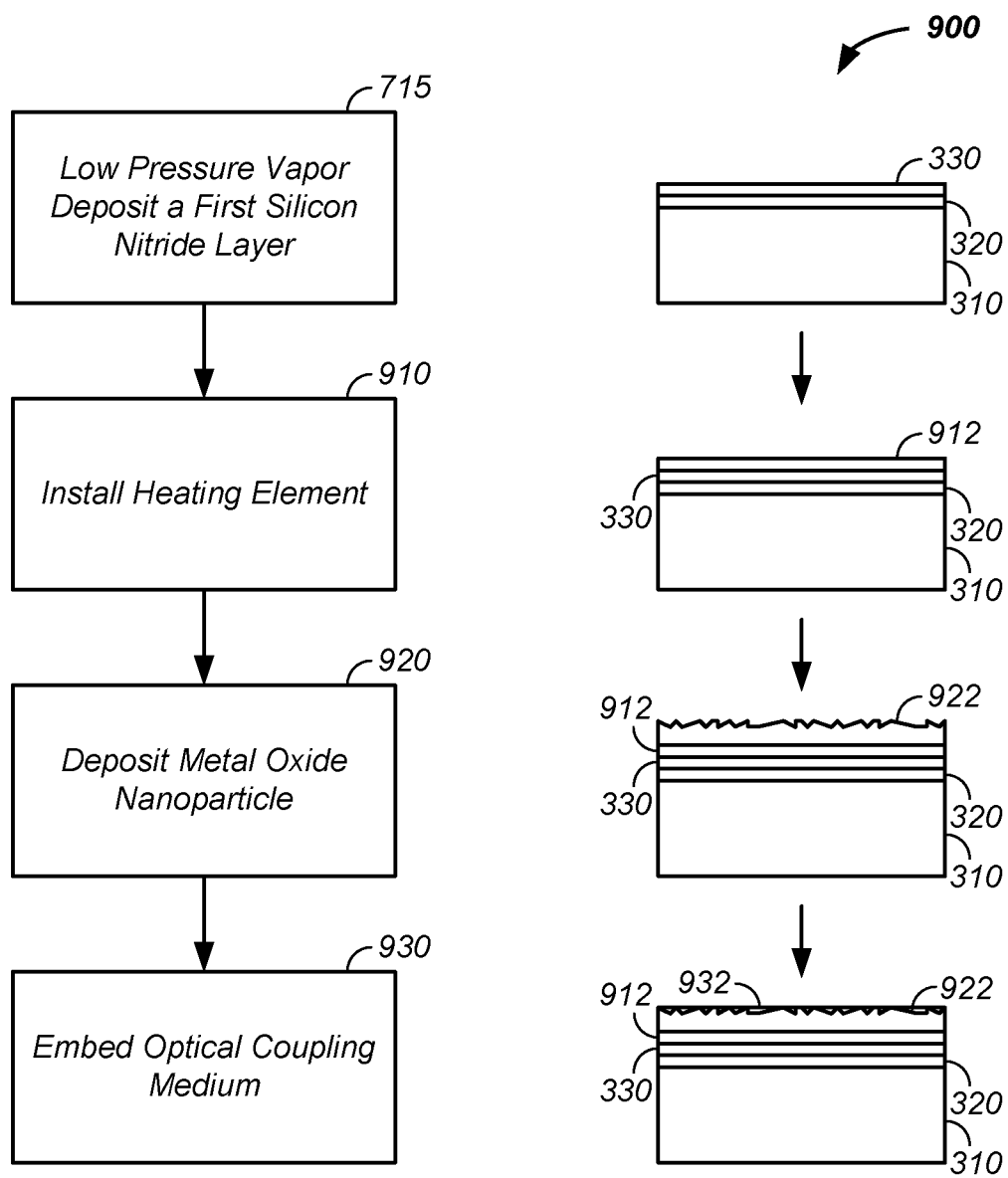
FIG. 9A and FIG. 9B illustrated adding a metal oxide nanoparticle layer to the solid state emitter.

Referring now to FIG. 9A a third manufacturing example is illustrated. In this example, the nanoparticle metal oxide layer 500 is added to the solid state source 100. The third manufacturing procedure 900 comprises one or more of the steps of:

installing a heat source 910, such as a heating element 912, onto a portion of the solid state source 100, such as a nitride layer;

depositing a layer of the nanoparticle metal oxide 920, such as nanoparticles of zinc oxide, onto the heating element 912, optionally after adding the intervening secondary lower sandwiching layer 335; and optionally embedding an optical coupling medium 930 into a formed or forming layer of nanoparticles of zinc oxide.

As described, supra, the source of heat/energy leading to the emission of mid-infrared photons from the zinc oxide nanoparticles is optionally conductive heat transfer from the zinc oxide layer heated with the applied current, such as through the embedded electrical connectors into/onto the zinc oxide film.

Example IV

Figure 9B:
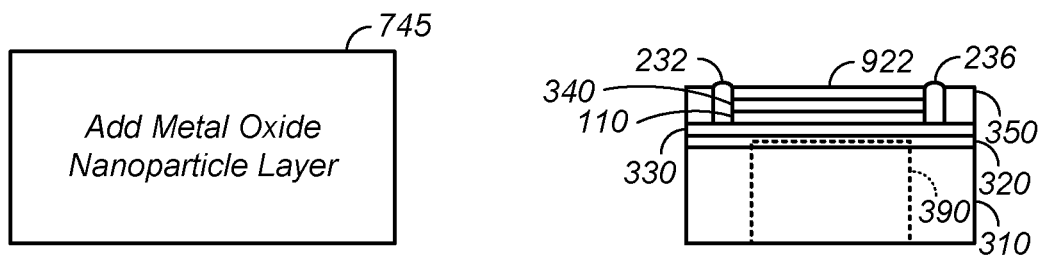

Referring now to FIG. 9B a fourth manufacturing example is illustrated. In this example, the connectors are added to the metal oxide layer and/or the zinc oxide layer. The fourth manufacturing procedure 800 comprises one or more of the steps of:

adding metal connectors 745, such as a first metal contact 238/first connector to the first wire 231 and/or a second metal contactor 239/second connector to the second wire 232, where the step of adding the metal connectors 745 optionally comprises the steps of drilling/etching/forming a hole/groove/channel into the solid state source 100 at least to the zinc oxide film and filling the resultant cavity, such as through deposition, with a conducting element, such as a metal, comprising a section of each of the metal contacts.

The connectors are optionally connected to the zinc oxide and/or the infrared emitter 110 through deposition of a connector, etching a surface to form an electrical connection, and/or through other processes known in the art.

Energy Delivery/Emission/Use

Figure 10:
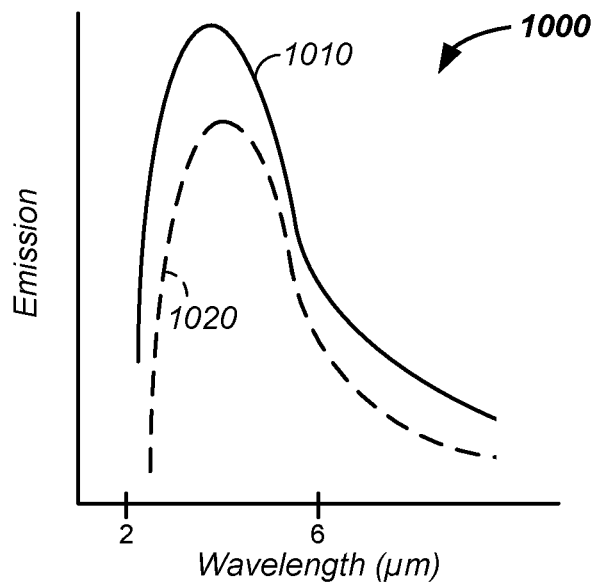
FIG. 10 illustrates emission of the solid state emitter.
Figure 11:
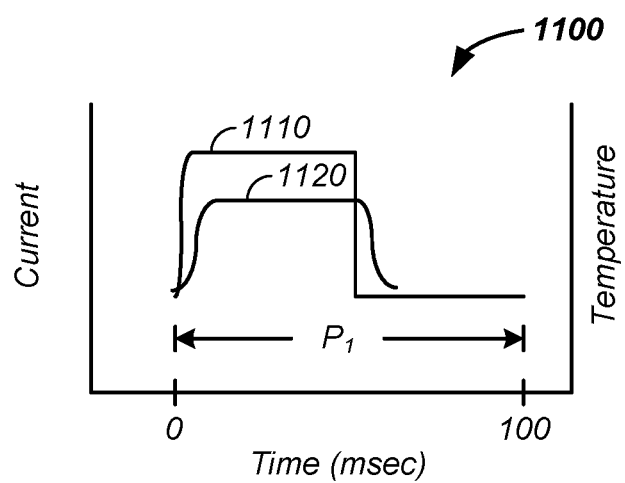
FIG. 11 illustrates light emission of the solid state emitter as a function of current, temperature, and time.

Referring now to FIGS. 10 and 11, emission of emission elements, the infrared emitter 110, the film of zinc oxide, the metal oxide nanoparticles 510, the ceramic, and/or the zinc oxide nanoparticles, in the solid state source 100 as a function of applied current, heat, and/or energy is described.

Referring still to FIG. 10, emission profiles 1000 of the solid state source 100 and/or the emission elements of the solid state source 100 is illustrated at a first temperature 1010 and at a second temperature 1020. Generally, the peak emission intensity of the solid state source 100 is in the range of 4 to 5 μm as described, supra, and the emission intensity is a function of applied voltage/current to the infrared emitter 110 or the conductive thermal transfer of heat to the metal oxide nanoparticles 510. The resultant infrared source of photons couples well with a lead salt detector, such as a lead selenide detector, a PbSe detector, a lead sulfide detector, and/or a PbS detector.

Referring again to FIG. 11, controlled temperature cycling 1100 of the solid state source 100 is illustrated. As illustrated, a pulsed current profile 1110 is applied to the infrared emitter 110. As illustrated, the alternating and/or pulsed current profile 1110 has a period of 100 milliseconds; however, the period is optionally greater than 1, 2, 5, 10, 50, or 100 milliseconds and/or less than 50, 100, 200, or 500 milliseconds. As the current is increased, the temperature profile 1120 of the infrared emitter 110 increases and when the current is stopped, switched off, and/or substantially reduced, the temperature profile 1120 of the infrared emitter 110 decreases, both the increase and the decrease in temperature lagging the current profile.

Referring again to FIG. 10 and still referring to FIG. 11, the inventor notes that the temperature profile 1120 of the infrared emitter 110 periodically cycles with a period of the applied pulsed current, that the lag is short, such as less than 1, 5, 10, 20, or 50 milliseconds, and that the change in temperature from a baseline to a peak in each period of the temperature profile 1120 is sufficient to drive the resultant emission of the infrared emitter 110 up and down in a periodic fashion due to the heat transfer design of the solid state source 100. More particularly, by the applied current heating the infrared emitter 110 directly, a time lag of an increase in temperature from, a baseline to 95 percent of maximum, of the infrared emitter 110 is less than 1, 5, 10, or 20 percent of the period of the applied pulsed current. Further, the heat dispersion/thickness and non-electrically conducting properties of the first layer 330 and second layer 340, such as the first nitride layer and the second nitride layer, in the sandwich structure about the infrared emitter 110 described supra, keep the current isolated in the infrared emitter 110 and facilitate rapid heat dispersion, respectively. Further, a thin thickness of the infrared emitter 110, such as less than 2, 5, 10, or 20 μm, facilitates heat dissipation from the infrared emitter 110 once the applied current is cycled down in the current profile 1110. Further, the film shape of the infrared emitter 110, with the current passing along/through a width and along/through a longitudinal axis/face of the film, where the width and/or length of the film is at least 2, 5, 10, 20, 50, 100, 500, or 1000 times the height of the deposited film, where the deposited film is less than 0.3, 0.4, 0.5, 0.75, or 1 μm, and/or where a ratio of the length times width of the film-to-the height of the film, [(l×w)/h] exceeds 500, 1000, 1500, 2000, and/or 4000-to-1, which also functions to rapidly disperse heat from the infrared emitter 110 once the applied current is reduced and/or cycled downward. For instance, the width of the infrared emitter 110 is preferably 1 or 2 millimeters wide and the thickness of the infrared emitter is preferably less than 0.5, 1, 1.5, 2, 3, 5, or 10 μm thick. Further, the rapid dissipation of heat energy from the infrared emitter 110 coupled with micrometer film thicknesses, such as less than 1, 2, 5, 10, 20, or 50 μm, of intervening layers, such as the second layer 340, allows a rapid heat increase and subsequent rapid temperature decrease of the nanoparticle metal oxide layer 500, and metal oxide nanoparticles 510 therein, as the pulsed current rises and falls, respectively, which yields an alternating increase and decrease of the emission from the metal oxide nanoparticles from a baseline to peak exceeding 50, 100, 1000, or 5000:1. Still further, the heating element 912, which is a film optionally and preferably approximating the dimensions of the infrared emitter 110 film and/or the nanoparticle metal oxide layer 500, has a large surface area-to-volume ratio of greater than 100 or 500:1 allowing rapid heating, rapid heat transfer to the metal oxide nanoparticles 510, and rapid heat dissipation, which again allows for pulsing and/or cycling resultant light emission from the solid state source 100. Still further, the clipping of the infrared emitter 110, such as in the patterning step 730 reduces the volume of the infrared emitter 110 to a desired source window without resultant heating of the infrared emitter 110 behind opaque, blocking, or thermally insulating elements of the solid state emitter 100, such as outside a light emission aperture. Still further, the step of reducing thermal mass 745 reduces the thermal mass of the solid state emitter 100, which facilitates temperature cycling and emission cycling of components thereof and maintaining a peak intensity to baseline difference as the solid state emitter 110 is used continuously. Still further, the low mass of the infrared emitter 110 and/or the heating element 912 facilitates use of a low power source, such as a source operating at less than 2, 1, 0.75, and/or 0.5 Watts, allowing battery and portable operation. Hence, the design of the solid state emitter 100 as a whole: (1) exceeds functionality of the individual elements of the solid state emitter 100; (2) comprising manufacturing steps result in a novel and unanticipated solid state source providing a new and useful functionality of a portable, small, readily manufactured, low power, and/or a periodically varying or on/off capability; and (3) comprising particular described combinations and orientations of components of the solid state emitter 100 result in a novel emission profile as a function of both wavelength and time.

Herein, the solid state source 100 is optionally used in any application requiring an infrared source, such as in a mid-infrared spectrometer, a mid-infrared meter, as a portion of an electronic device, and/or as a portion of a light-emitting diode.

Herein, zinc oxide is optionally replaced with any conductor, such as silver, aluminum, platinum, and/or copper or with an oxide of any of the conductors, such as silver oxide, aluminum oxide, black platinum, and/or copper oxide. Further, zinc oxide is optionally replaced with a ceramic material. More generally, zinc oxide, which is an inorganic compound and a wide-bandgap semiconductor of the II-VI semiconductor group is optionally replaced with any wide-bandgap semiconductor of the II-VI group. Preferably, material substituted for the zinc oxide comprises the inventor noted benefits of zinc oxide: a semi-transparent material as defined supra, high electron mobility, a wide band gap, and a strong luminescence at room temperature.

Herein, any particular element or particular chemical composite, such as Si, $SiO_2$, ZnO, SiN, is optionally substantially, such as greater than 70, 80, 90, 95, or 99%, the particular element or the particular chemical deposit, where impurities and/or doped material make up a mass balance of the particular element of the particular chemical composite.

Still yet another embodiment includes any combination and/or permutation of any of the elements described herein.

The main controller, a localized communication apparatus, and/or a system for communication of information optionally comprises one or more subsystems stored on a client. The client is a computing platform configured to act as a client device or other computing device, such as a computer, personal computer, a digital media device, and/or a personal digital assistant. The client comprises a processor that is optionally coupled to one or more internal or external input device, such as a mouse, a keyboard, a display device, a voice recognition system, a motion recognition system, or the like. The processor is also communicatively coupled to an output device, such as a display screen or data link to display or send data and/or processed information, respectively. In one embodiment, the communication apparatus is the processor. In another embodiment, the communication apparatus is a set of instructions stored in memory that is carried out by the processor.

The client includes a computer-readable storage medium, such as memory. The memory includes, but is not limited to, an electronic, optical, magnetic, or another storage or transmission data storage medium capable of coupling to a processor, such as a processor in communication with a touch-sensitive input device linked to computer-readable instructions. Other examples of suitable media include, for example, a flash drive, a CD-ROM, read only memory (ROM), random access memory (RAM), an application-specific integrated circuit (ASIC), a DVD, magnetic disk, an optical disk, and/or a memory chip. The processor executes a set of computer-executable program code instructions stored in the memory. The instructions may comprise code from any computer-programming language, including, for example, C originally of Bell Laboratories, C++, C#, Visual Basic® (Microsoft, Redmond, Wash.), Matlab® (Math-Works, Natick, Mass.), Java® (Oracle Corporation, Redwood City, Calif.), and JavaScript® (Oracle Corporation, Redwood City, Calif.).

Herein, any number, such as 1, 2, 3, 4, 5, is optionally more than the number, less than the number, or within 1, 2, 5, 10, 20, or 50 percent of the number.

Herein, an element and/or object is optionally manually and/or mechanically moved, such as along a guiding element, with a motor, and/or under control of the main controller.

The particular implementations shown and described are illustrative of the invention and its best mode and are not intended to otherwise limit the scope of the present invention in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationships or physical connections may be present in a practical system.

In the foregoing description, the invention has been described with reference to specific exemplary embodiments; however, it will be appreciated that various modifications and changes may be made without departing from the scope of the present invention as set forth herein. The description and figures are to be regarded in an illustrative manner, rather than a restrictive one and all such modifications are intended to be included within the scope of the present invention. Accordingly, the scope of the invention should be determined by the generic embodiments described herein and their legal equivalents rather than by merely the specific examples described above. For example, the steps recited in any method or process embodiment may be executed in any order and are not limited to the explicit order presented in the specific examples. Additionally, the components and/or elements recited in any apparatus embodiment may be assembled or otherwise operationally configured in a variety of permutations to produce substantially the same result as the present invention and are accordingly not limited to the specific configuration recited in the specific examples.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

Although the invention has been described herein with reference to certain preferred embodiments, one skilled in the art will readily appreciate that other applications may be substituted for those set forth herein without departing from the spirit and scope of the present invention. Accordingly, the invention should only be limited by the Claims included below.

The invention claimed is:

1. An apparatus, comprising:
a solid state source, comprising:
   a semi-transparent electrically conductive film, comprising a transmission property of at least forty percent, wherein in said transmission property at least forty percent of internal infrared emissions from said semi-transparent electrically conductive film transmit to an outer surface of said semi-transparent electrically conductive film, wherein the infrared emissions comprise a peak intensity between 3.9 and 6 micrometers;
   a first silicon nitride layer;
   a second silicon nitride layer, said semi-transparent electrically conductive film positioned between said first silicon nitride layer and said second silicon nitride layer;
   a first electrical contact on a first end of said semi-transparent electrically conductive film; and
   a second electrical contact on a second end of said semi-transparent electrically conductive film,
   wherein, upon applying an electric current of less than one Watt, during use, from said first electrical contact, though said semi-transparent electrically conductive film, and to said second electrical contact, said semi-transparent electrically conductive film rises from within one hundred degrees centigrade of room temperature to in excess of five hundred degrees centigrade in less than twenty milliseconds.

2. A method, comprising the steps of:
providing a solid state source, comprising:
   a semi-transparent electrically conductive film comprising a transmission property of at least forty percent, wherein at least forty percent of internal infrared emissions from a center of said semi-transparent electrically conductive film transmit to an outer surface of said semi-transparent electrically conductive film, wherein the infrared emissions comprise a peak intensity between 3.9 and 6 micrometers;
   a first silicon nitride layer;
   a second silicon nitride layer, said semi-transparent electrically conductive film positioned between said first silicon nitride layer and said second silicon nitride layer;
   a first electrical contact on a first end of said semi-transparent electrically conductive film; and
   a second electrical contact on a second end of said semi-transparent electrically conductive film; and
applying an electric current of less than one Watt from said first electrical contact, though said semi-transparent electrically conductive film, and to said second electrical contact, said semi-transparent electrically conductive film rising from within one hundred degrees centigrade of room temperature to in excess of eight hundred degrees centigrade in less than twenty milliseconds.

\* \* \* \* \*